(12) United States Patent
Tagami et al.

(10) Patent No.: US 12,382,698 B2
(45) Date of Patent: Aug. 5, 2025

(54) SEMICONDUCTOR DEVICE AND METHOD FOR MANUFACTURING THE SAME

(71) Applicant: Kioxia Corporation, Tokyo (JP)

(72) Inventors: Masayoshi Tagami, Kuwana Mie (JP); Katsuyuki Kitamoto, Yokkaichi Mie (JP); Ken Komiya, Nagoya Aichi (JP)

(73) Assignee: KIOXIA CORPORATION, Tokyo (JP)

( * ) Notice: Subject to any disclaimer, the term of this patent is extended or adjusted under 35 U.S.C. 154(b) by 975 days.

(21) Appl. No.: 17/190,728

(22) Filed: Mar. 3, 2021

(65) Prior Publication Data

US 2022/0069093 A1 Mar. 3, 2022

(30) Foreign Application Priority Data

Aug. 31, 2020 (JP) ................. 2020-145957

(51) Int. Cl.
| | |
|---|---|
| *H10D 64/23* | (2025.01) |
| *H01L 23/00* | (2006.01) |
| *H01L 25/18* | (2023.01) |
| *H10B 43/10* | (2023.01) |
| *H10B 43/27* | (2023.01) |
| *H10B 43/35* | (2023.01) |
| *H10D 30/69* | (2025.01) |
| *H10D 64/01* | (2025.01) |

(52) U.S. Cl.
CPC ........... *H10D 64/258* (2025.01); *H01L 24/82* (2013.01); *H01L 25/18* (2013.01); *H10B 43/10* (2023.02);
(Continued)

(58) Field of Classification Search
CPC ... H01L 29/41775; H01L 24/82; H01L 25/18; H01L 29/40117; H01L 29/42344; H01L 2224/8234; H01L 2924/1431; H01L 2924/1438; H01L 24/08; H01L 24/80; H01L 2224/08145; H01L 2224/8003; H01L 2224/80357; H01L 2224/80895;
(Continued)

(56) References Cited

U.S. PATENT DOCUMENTS 10,490,498 B2 11/2019 Yeh et al.
10,804,279 B2 * 10/2020 Hu ..................... G11C 16/04
(Continued)

FOREIGN PATENT DOCUMENTS

CN 110718552 A 1/2020
CN 110880517 A 3/2020
(Continued)

*Primary Examiner* — Eliseo Ramos Feliciano
*Assistant Examiner* — Sophia W Kao
(74) *Attorney, Agent, or Firm* — Foley & Lardner LLP

(57) ABSTRACT

A semiconductor device includes: a plurality of first electrode films stacked in a state of being insulated from each other; a plurality of semiconductor members extending in a stacked direction of the plurality of first electrode films in a stacked body of the plurality of first electrode films; a plurality of charge storage members provided between the plurality of first electrode films and the plurality of semiconductor members; a first conductive film having a first surface, and commonly connected to the plurality of semiconductor members on the first surface; a first insulating film provided on a second surface of the first conductive film on the side opposite to the first surface; a contact provided in the first insulating film and connected to the first conductive film; and a second conductive film provided on the first insulating film and connected to the contact.

17 Claims, 19 Drawing Sheets

(52) U.S. Cl.
CPC ............. *H10B 43/27* (2023.02); *H10B 43/35* (2023.02); *H10D 30/696* (2025.01); *H10D 64/037* (2025.01); *H01L 2224/8234* (2013.01); *H01L 2924/1431* (2013.01); *H01L 2924/1438* (2013.01)

(58) Field of Classification Search
CPC . H01L 2224/80896; H01L 2225/06548; H01L 25/50; H10B 43/10; H10B 43/27; H10B 43/35; H10B 41/27
See application file for complete search history.

(56) References Cited

U.S. PATENT DOCUMENTS

| | | | |
|---|---|---|---|
| 11,011,506 B2* | 5/2021 | Hosoda | H10B 43/50 |
| 11,024,600 B2* | 6/2021 | Liu | H01L 25/18 |
| 11,217,602 B2* | 1/2022 | Bin | H10B 43/27 |
| 11,626,416 B2* | 4/2023 | Zhang | H10B 43/40 438/268 |
| 2018/0247951 A1* | 8/2018 | Fujii | H10B 43/50 |
| 2019/0051599 A1 | 2/2019 | Zhang et al. | |
| 2019/0198524 A1 | 6/2019 | Fujiki et al. | |
| 2019/0296041 A1* | 9/2019 | Yamasaka | H01L 27/0688 |
| 2020/0020713 A1 | 1/2020 | Choi et al. | |
| 2020/0027892 A1* | 1/2020 | Zhu | H10B 43/40 |
| 2020/0098776 A1* | 3/2020 | Sugisaki | H10B 43/40 |
| 2021/0320118 A1* | 10/2021 | Zhang | H10B 43/40 |
| 2022/0199531 A1* | 6/2022 | Xiao | H01L 21/76889 |

FOREIGN PATENT DOCUMENTS

| | | |
|---|---|---|
| CN | 110931489 A | 3/2020 |
| CN | 111566816 A | 8/2020 |
| TW | 201941407 A | 10/2019 |
| TW | 202013684 A | 4/2020 |

* cited by examiner

SEMICONDUCTOR DEVICE AND METHOD FOR MANUFACTURING THE SAME

CROSS-REFERENCE TO RELATED APPLICATION(S)

This application is based upon and claims the benefit of priority from Japanese Patent Application No. 2020-145957, filed on Aug. 31, 2020, the entire contents of which are incorporated herein by reference.

FIELD

Embodiments described herein related generally to a semiconductor device, and a method for manufacturing the same.

BACKGROUND

A semiconductor device such as a NAND type flash memory may have a structure in which a memory cell array is provided above a complementary metal oxide semiconductor (CMOS) circuit for miniaturization. A common source layer of the memory cell array is positioned above the CMOS circuit. The source layer may store charges and cause arcing in an etching processing of forming a memory hole or a slit that penetrates the memory cell array. To prevent arcing, in a semiconductor wafer processing process, the source layer is partially connected to a conductive layer provided in a dicing area, and the charges are released to the ground via the connected portion between the source layer and the conductive layer.

The connected portion, however, is necessary to be divided after the memory hole or the slit is formed, and thus, it is necessary to add lithography processing and etching processing. This increases the manufacturing processing steps of the semiconductor device and therefore increases the manufacturing cost.

DETAILED DESCRIPTION

Figure 1:
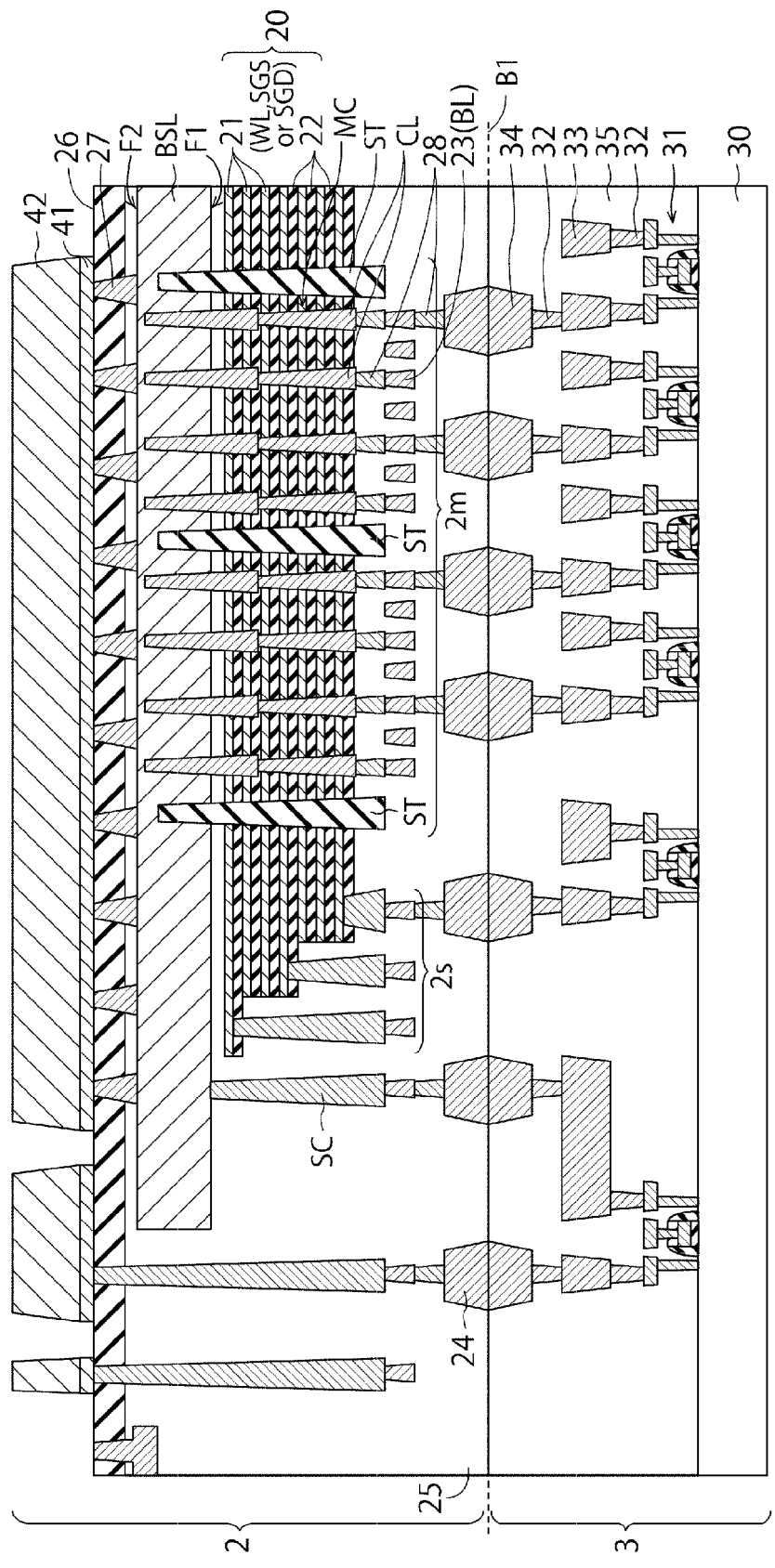
FIG. 1 is a cross-sectional view illustrating an example of a configuration of a semiconductor device according to a first embodiment.

At least one embodiment provides a semiconductor device and a method for manufacturing the same, which may reduce the manufacturing processing and the manufacturing cost while preventing the arcing of the source layer under the memory cell array in the etching processing of the semiconductor manufacturing process.

In general, according to at least one embodiment, a semiconductor device includes a plurality of first electrode films stacked in a state of being insulated from each other. A plurality of semiconductor members extends in a stacked direction of the plurality of first electrode films in a stacked body of the plurality of first electrode films. A plurality of charge storage members is provided between the plurality of first electrode films and the plurality of semiconductor members. A first conductive film includes a first surface, and is commonly connected to the plurality of semiconductor members on the first surface. A first insulating film is provided on a second surface of the first conductive film on the side opposite to the first surface. A contact is provided in the first insulating film and connected to the first conductive film. A second conductive film is provided on the first insulating film and connected to the contact.

Hereinafter, at least one embodiment of the present disclosure will be described with reference to drawings. The present disclosure is not limited to the embodiments. In the following embodiments, the vertical direction of a substrate 30 indicates a relative direction when a surface on which a semiconductor element is provided is up or down, and may be different from the vertical direction according to the gravitational acceleration. The drawings are schematic or conceptual, and the ratio of each part is not always the same as the actual ratio. In the specification and the drawings, the same elements as those described above with respect to the existing drawings are designated by the same reference numerals, and detailed descriptions thereof will be omitted as appropriate.

First Embodiment

FIG. 1 is a cross-sectional view illustrating an example of a configuration of a semiconductor device 1 according to a first embodiment. Hereinafter, a staked direction of a stacked body 20 is defined as the Z direction. One direction intersecting, for example, orthogonal to the Z direction is defined as the Y direction. One direction respectively intersecting, for example, orthogonal to the Z direction and the Y direction is defined as the X direction.

The semiconductor device 1 includes a memory chip 2 having a memory cell array, and a controller chip 3 having a CMOS circuit. The memory chip 2 and the controller chip 3 are bonded to each other on a bonding surface B1, and are electrically connected to each other via wirings bonded on the bonding surface. FIG. 1 illustrates a state where the memory chip 2 is mounted on the controller chip 3.

The controller chip 3 includes a substrate 30, CMOS circuits 31, vias 32, wirings 33 and 34, and an interlayer insulating film 35.

The substrate 30 is, for example, a semiconductor substrate such as a silicon substrate. The CMOS circuit 31 is configured as a transistor provided on the substrate 30. Semiconductor elements such as resistance elements and capacitive elements other than the CMOS circuit 31 may be formed on the substrate 30.

The via 32 electrically connects the CMOS circuit 31 and the wiring 33, or the wiring 33 and the wiring 34. The wirings 33 and 34 configure a multi-layer wiring structure in the interlayer insulating film 35. The wiring 34 is embedded in the interlayer insulating film 35, and is exposed on the surface of the interlayer insulating film 35 at the substantially same height. The wirings 33 and 34 are electrically connected to, for example, the CMOS circuit 31. For example, a low resistance metal such as copper or tungsten is used for the via 32, and the wiring 33 and 34. The interlayer insulating film 35 coats and protects the CMOS circuit 31, the via 32, and the wirings 33 and 34. For example, an insulating film such as a silicon oxide film is used for the interlayer insulating film 35.

The memory chip 2 includes a stacked body 20, columnar portions CL, slits ST, a source layer BSL, an interlayer insulating film 25, an insulating film 26, contacts 27, and conductive films 41 and 42.

The stacked body 20 is provided above the CMOS circuit 31, and is positioned in the Z direction with respect to the substrate 30. In the stacked body 20, a plurality of electrode films 21 and a plurality of insulating films 22 are alternately stacked along the Z direction. For example, a conductive metal such as tungsten is used for the electrode film 21. For example, an insulating film such as a silicon oxide film is used for the insulating film 22. The insulating film 22 insulates the electrode films 21 from each other. That is, the plurality of electrode films 21 are stacked in a state of being insulated from each other. The number of the respective stacked electrode films 21 and the insulating films 22 may be freely chosen. The insulating film 22 may be, for example, a porous insulating film or an air gap.

One or a plurality of electrode films 21 at the upper end and the lower end of the stacked body 20 in the Z direction functions as a source-side select gate SGS and a drain-side select gate SGD, respectively. The electrode film 21 between the source-side select gate SGS and the drain-side select gate SGD functions as a word line WL. The word line WL is a gate electrode of a memory cell MC. The drain-side select gate SGD is a gate electrode of a drain-side select transistor. The source-side select gate SGS may be provided on the upper area of the stacked body 20. The drain-side select gate SGD is provided on the lower area of the stacked body 20. The upper area refers to the area of the stacked body 20 on the side close to the controller chip 3, and the lower area refers to the area of the stacked body 20 on the side (the side close to the conductive films 41 and 42) far from the controller chip 3.

The semiconductor device 1 includes a plurality of memory cells MC connected in series between the source-side select transistor and the drain-side select transistor. The structure in which the source-side select transistor, the memory cell MC, and the drain-side select transistor are connected in series is called a "memory string," or "NAND string." The memory string is connected to a bit line BL via, for example, a via 28. The bit line BL is a wiring 23 provided below the stacked body 20 and extending in the X direction (paper direction in FIG. 1).

A plurality of columnar portions CL is provided in the stacked body 20. The columnar portion CL extends so as to penetrate the stacked body 20 in the stacked direction (Z direction) of the stacked body 20 in the stacked body 20, and is provided from the via 28 connected to the bit line BL to the source layer BSL. The internal configuration of the columnar portion CL is described below. In at least one embodiment, since the columnar portion CL has a high aspect ratio, the columnar portion CL is formed in two stages in the Z direction. However, there is no problem even when the columnar portion CL has one stage.

Further, a plurality of slits ST is provided in the stacked body 20. The slit ST extends in the X direction, and penetrates the stacked body 20 in the stacked direction (Z direction) of the stacked body 20. The slit ST is filled with an insulating film such as a silicon oxide film, and the insulating film is formed in a plate shape. The slit ST electrically separates the electrode films 21 in the stacked body 20.

The source layer BSL is provided on the stacked body 20 via the insulating film. The source layer BSL is provided corresponding to the stacked body 20. The source layer BSL includes a first surface F1 and a second surface F2 on the side opposite to the first surface F1. The stacked body 20 is provided on the first surface F1 side of the source layer BSL, and the insulating film 26, the contacts 27, and the conductive films 41 and 42 are provided on the second surface F2 side. The source layer BSL is commonly connected to one end of the plurality of columnar portions CL, and gives a common source potential to the plurality of columnar portions CL in a same memory cell array 2m. That is, the source layer BSL functions as a common source electrode of the memory cell array 2m. For example, a conductive material such as doped polysilicon is used for the source layer BSL. For example, a low resistance metal such as copper, aluminum, or tungsten is used for the conductive films 41 and 42. For example, an insulating film such as a silicon nitride film is used for the insulating film 26. A reference numeral "2s" indicates a stepped portion of the electrode film 21 connecting the contact to each electrode film 21. The stepped portion 2s will be described below with reference to FIG. 2.

The contacts 27 are provided in the insulating film 26. The contacts 27 are provided between the source layer BSL and the conductive films 41 and 42, and electrically connect the source layer BSL and the conductive films 41 and 42. It is preferable that the contacts 27 are arranged on the stacked body 20 substantially evenly in the X-Y plane of the stacked body 20. Therefore, when the columnar portion CL or the slit ST is formed, the resistance value from the columnar portion CL or the slit ST at any position in the stacked body 20 to a substrate (50 in FIG. 8) is substantially evenly reduced, and the charge generated when the columnar portion CL or the slit ST is formed easily flows to the source layer BSL. This leads to prevention of arcing at the time when the columnar portion CL or the slit ST is formed.

Figure 12:
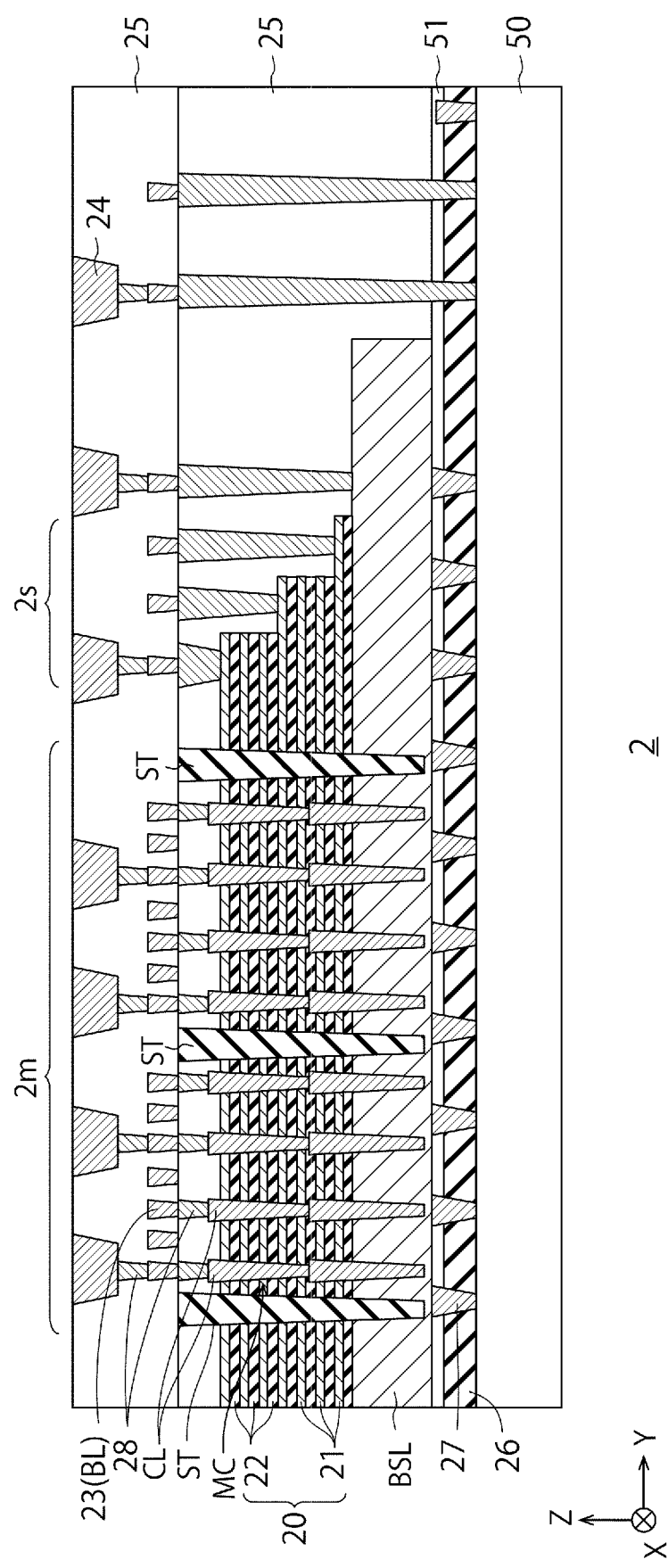
FIG. 12 is a cross-sectional view illustrating the example of the method for manufacturing the memory chip subsequent to FIG. 11.

In at least one embodiment, the memory chip 2 and the controller chip 3 are individually formed, and are bonded to each other on the bonding surface B1. Therefore, the CMOS circuit 31 is not provided in the memory chip 2. Further, the stacked body 20 (i.e., memory cell array 2m) is not provided in the controller chip 3. Both the CMOS circuit 31 and the stacked body 20 are on the first surface F1 side of the source layer BSL. The CMOS circuit 31 is on the side opposite to the second surface F2 side on which the conductive films 41 and 42 exist. Therefore, as illustrated in FIG. 12, in the manufacturing processing of the memory chip 2, the CMOS circuit is not provided between the source layer BSL and the substrate 50. Therefore, the contacts 27 may be provided between the source layer BSL immediately below the stacked body 20 and the substrate 50. The number of the contacts 27 is not particularly limited.

The conductive films 41 and 42 are provided on the insulating film 26 and the contacts 27, and are electrically commonly connected to the contacts 27. The conductive films 41 and 42 may apply a source potential from the outside of the semiconductor device 1 to the source layer BSL via the contacts 27. The contacts 27 are arranged substantially evenly in the plane (X-Y plane) perpendicular to the Z direction, corresponding to the stacked body 20 and the source layer BSL. Therefore, the source potential may be applied substantially evenly to the source layer BSL.

The vias 28 and the wirings 23 and 24 are provided below the stacked body 20. The wirings 23 and 24 configure a multi-layer wiring structure in the interlayer insulating film 25. The wiring 24 is embedded in the interlayer insulating film 25, and is exposed on the surface of the interlayer insulating film 25 at the substantially same height. The wirings 23 and 24 are electrically connected to, for example, a semiconductor body 210 of the columnar portion CL. For example, a low resistance metal such as copper or tungsten is used for the via 28, and the wiring 23 and 24. The interlayer insulating film 25 coats and protects the stacked body 20, the via 28, and the wirings 23 and 24. For example, an insulating film such as a silicon oxide film is used for the interlayer insulating film 25.

The interlayer insulating film 25 and the interlayer insulating film 35 are bonded to each other on the bonding surface B1, and the wiring 24 and the wiring 34 are bonded to each other on the bonding surface B1 at the substantially same height. Therefore, the memory chip 2 and the controller chip 3 are electrically connected to each other via the wirings 24 and 34.

Figure 2:
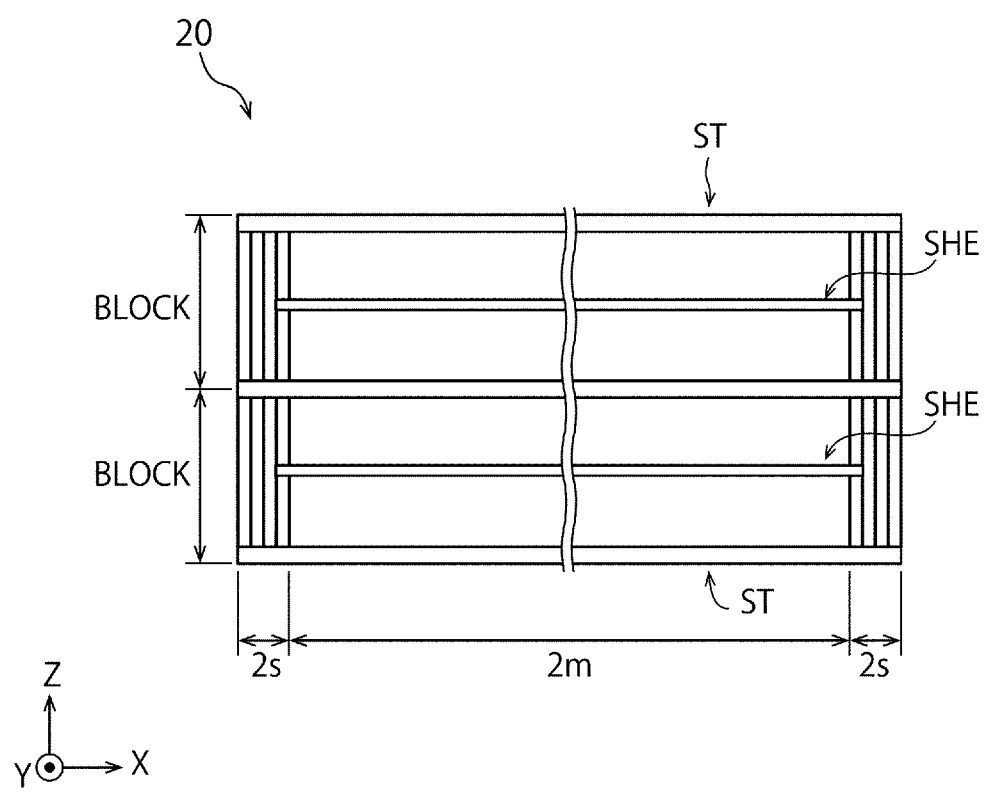
FIG. 2 is a schematic plan view illustrating a stacked body.

FIG. 2 is a schematic plan view illustrating the stacked body 20. The stacked body 20 includes the stepped portion 2s and the memory cell array 2m. The stepped portion 2s is provided on the edge portion of the stacked body 20. The memory cell array 2m is sandwiched or surrounded by the stepped portion 2s. The slit ST is provided from the stepped portion 2s at one end of the stacked body 20 to the stepped portion 2s at the other end of the stacked body 20 through the memory cell array 2m. A slit SHE is provided at least in the memory cell array 2m. The slit SHE is thinner than the slit ST, and extends substantially in parallel with the slit ST. The slit SHE electrically separates the electrode film 21 for each drain-side select gate SGD.

A portion of the stacked body 20 sandwiched by two slits ST illustrated in FIG. 2 is called a block (BLOCK). The block constitutes, for example, the smallest unit of data elimination. The slit SHE is provided in the block. The stacked body 20 between the slit ST and the slit SHE is called a finger. The drain-side select gate SGD is separated for each finger. As a result, when recording or reading data, one finger in the block may be selected by the drain-side select gate SGD.

Figure 3:
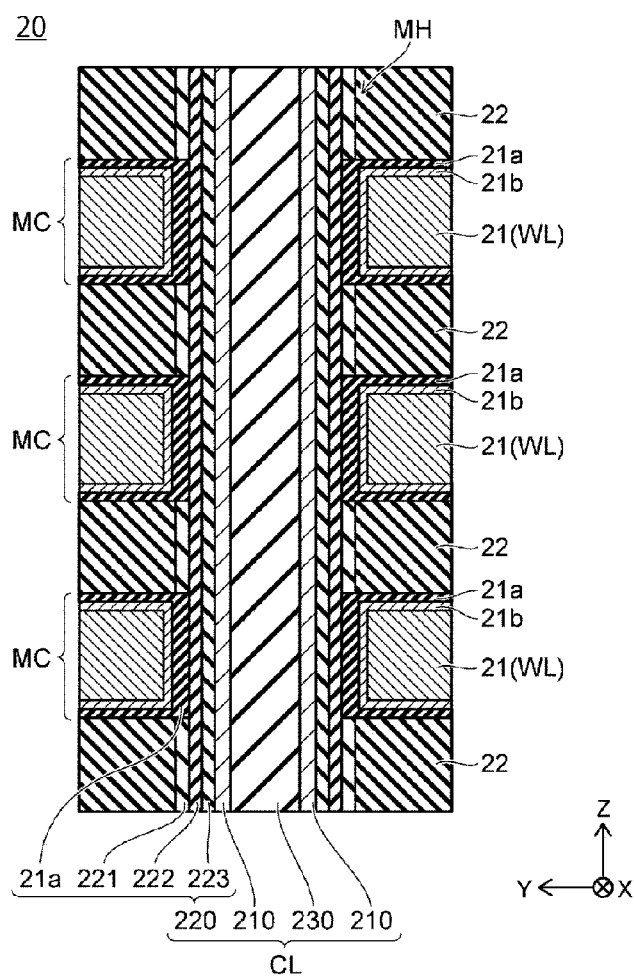
FIG. 3 is a schematic cross-sectional view illustrating a memory cell having a three-dimensional structure.
Figure 4:
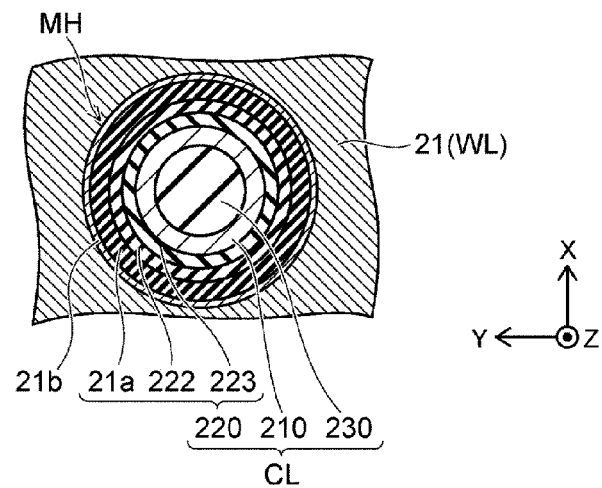
FIG. 4 is a schematic cross-sectional view illustrating a memory cell having a three-dimensional structure.

Each of FIG. 3 and FIG. 4 is a schematic cross-sectional view illustrating a memory cell having a three-dimensional structure. Each of the plurality of columnar portions CL is provided in a memory hole MH provided in the stacked body 20. Each columnar portion CL penetrates the stacked body 20 from the upper end of the stacked body 20 along the Z direction, and is disposed in the stacked body 20 and the source layer BSL. The plurality of columnar portions CL include the semiconductor body 210, a memory film 220, and a core layer 230, respectively. The columnar portion CL includes the core layer 230 provided at the center thereof, the semiconductor body (semiconductor member) 210 provided around the core layer 230, and the memory film (charge storage member) 220 provided around the semiconductor body 210. The semiconductor body 210 extends in the stacked direction (Z direction) in the stacked body 20. The semiconductor body 210 is electrically connected to the source layer BSL. The memory film 220 is provided between the semiconductor body 210 and the electrode film 21, and includes a charge capturing portion. A plurality of columnar portions CL selected one by one from each finger is commonly connected to one bit line BL via the via 28 in FIG. 1. Each of the columnar portions CL is provided, for example, in the area of the memory cell array 2m.

As illustrated in FIG. 4, the shape of the memory hole MH in the X-Y plane is, for example, a circle or an ellipse. A block insulating film 21a that constitutes a part of the memory film 220 may be provided between the electrode film 21 and the insulating film 22. The block insulating film 21a is, for example, a silicon oxide film or a metal oxide film. One example of a metal oxide is an aluminum oxide. A barrier film 21b may be provided between the electrode film 21 and the insulating film 22, and between the electrode film 21 and the memory film 220. As the barrier film 21b, for example, when the electrode film 21 is made of tungsten, for example, a stacked structure film of titanium nitride and titanium is selected. The block insulating film 21a prevents back tunneling of the charge from the electrode film 21 to the memory film 220 side. The barrier film 21b improves the adhesion between the electrode film 21 and the block insulating film 21a.

The shape of the semiconductor body 210 as a semiconductor member is, for example, a tubular shape having a bottom. For example, polysilicon is used for the semiconductor body 210. The semiconductor body 210 is made of, for example, undoped silicon. Further, the semiconductor body 210 may be p-type silicon. The semiconductor body 210 serves as a channel for each of the drain-side select transistor STD, the memory cell MC, and the source-side select transistor STS. One end of a plurality of semiconductor body 210 in the same memory cell array 2m is electrically commonly connected to the source layer BSL.

A portion of the memory film 220 other than the block insulating film 21a is provided between the inner wall of the memory hole MH and the semiconductor body 210. The shape of the memory film 220 is, for example, a tubular shape. The plurality of memory cells MC have a storage area between the semiconductor body 210 and the electrode film 21 serving as the word line WL, and are stacked in the Z direction. The memory film 220 includes, for example, a cover insulating film 221, a charge capturing film 222, and a tunnel insulating film 223. Each of the semiconductor body 210, the charge capturing film 222, and the tunnel insulating film 223 extends in the Z direction.

The cover insulating film 221 is provided between the insulating film 22 and the charge capturing film 222. The cover insulating film 221 contains, for example, silicon oxide. The cover insulating film 221 protects the charge capturing film 222 so as not to be etched when a sacrificial film (not illustrated) is replaced with the electrode film 21 (replacement processing). The cover insulating film 221 may be removed from between the electrode film 21 and the memory film 220 during the replacement processing. In this case, as illustrated in FIGS. 3 and 4, for example, the block insulating film 21a is provided between the electrode film 21 and the charge capturing film 222. Further, when the replacement processing is not used to form the electrode film 21, the cover insulating film 221 may be omitted.

The charge capturing film 222 is provided between each of the block insulating film 21a and the cover insulating film 221, and the insulating film 223. The charge capturing film 222 contains, for example, silicon nitride, and includes a trap site that traps charges in the film. A portion of the charge capturing film 222 sandwiched between the electrode film 21 serving as the word line WL and the semiconductor body 210 constitutes the storage area of the memory cell MC as the charge capturing portion. A threshold voltage of the memory cell MC changes depending on the presence or absence of charge in the charge capturing portion, or the amount of charge captured in the charge capturing portion. Therefore, the memory cell MC stores information.

The tunnel insulating film 223 is provided between the semiconductor body 210 and the charge capturing film 222. The tunnel insulating film 223 contain, for example, silicon oxide, or silicon oxide and silicon nitride. The tunnel insulating film 223 is a potential barrier between the semiconductor body 210 and the charge capturing film 222. For example, when electrons are injected from the semiconductor body 210 to the charge capturing portion (writing operation), and when holes are injected from the semiconductor body 210 to the charge capturing portion (eliminating operation), the electrons and the holes pass through (tunneling) the potential barrier of the tunnel insulating film 223, respectively.

The core layer 230 is embedded in the internal space of the tubular semiconductor body 210. The shape of the core layer 230 is, for example, a columnar shape. The core layer 230 contains, for example, silicon oxide, and is insulating.

The stacked body 20 and the memory cell array 2m of the memory chip 2 may be configured in this manner.

Next, a method for manufacturing the semiconductor device 1 according to at least one embodiment will be described.

(Method for Manufacturing Memory Chip)

FIGS. 5 to 12 are cross-sectional views illustrating an example of a method for manufacturing the memory chip 2 according to the first embodiment.

Figure 5:
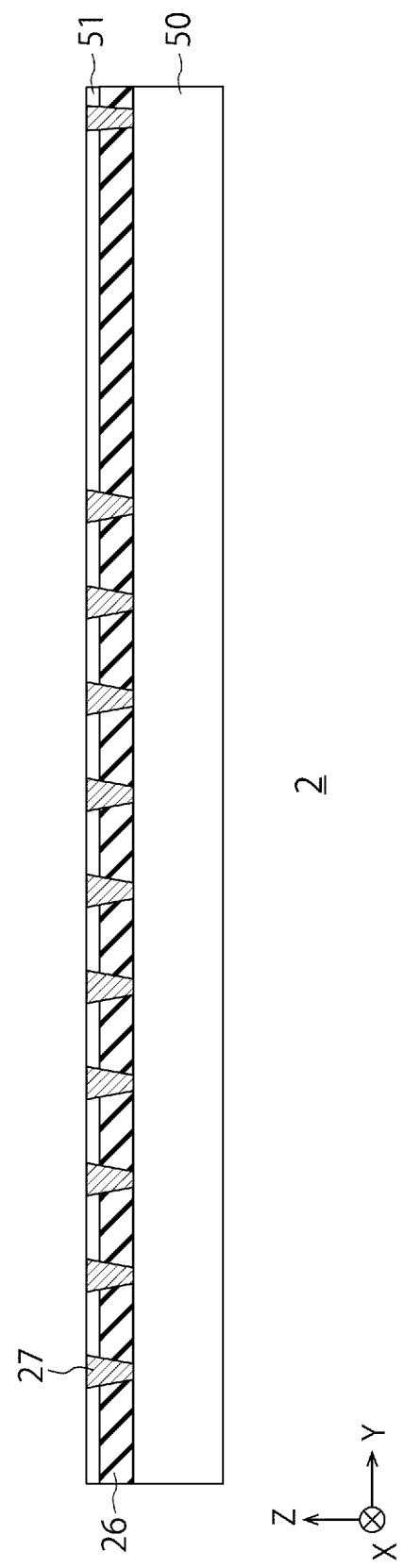
FIG. 5 is a cross-sectional view illustrating an example of a method for manufacturing a memory chip according to the first embodiment.

First, as illustrated in FIG. 5, the insulating films 26 and 51 are formed on the substrate 50 serving as a first substrate. For example, a silicon nitride film is used for the insulating film 26. For example, a silicon oxide film is used for the insulating film 51. Next, the insulating films 26 and 51 are processed using a lithography technique and an etching technique to form contact holes. Further, a conductor is embedded in the contact hole to form the contact 27. The contact 27 is formed below the source layer BSL and the stacked body 20 formed later. The contact 27 penetrates the insulating film 51 and is electrically connected to the substrate 50. It is preferable that the contacts 27 are arranged substantially evenly in the formation area of the source layer BSL. By polishing the material of the contact 27 using a chemical mechanical polishing (CMP) method, the surface of the contact 27 has the substantially same height as the surface of the insulating film 26 or 51. For example, a conductive material such as doped polysilicon, copper, or tungsten may be used for the contact 27.

The insulating films 26 and 51 and the contact 27 may be formed in the same processing as an alignment mark forming processing used in, for example, a lithography processing. Therefore, the forming processing of the insulating films 26 and 51 and the contact 27 does not require an additional processing, and ends by changing the mask pattern.

Figure 6:
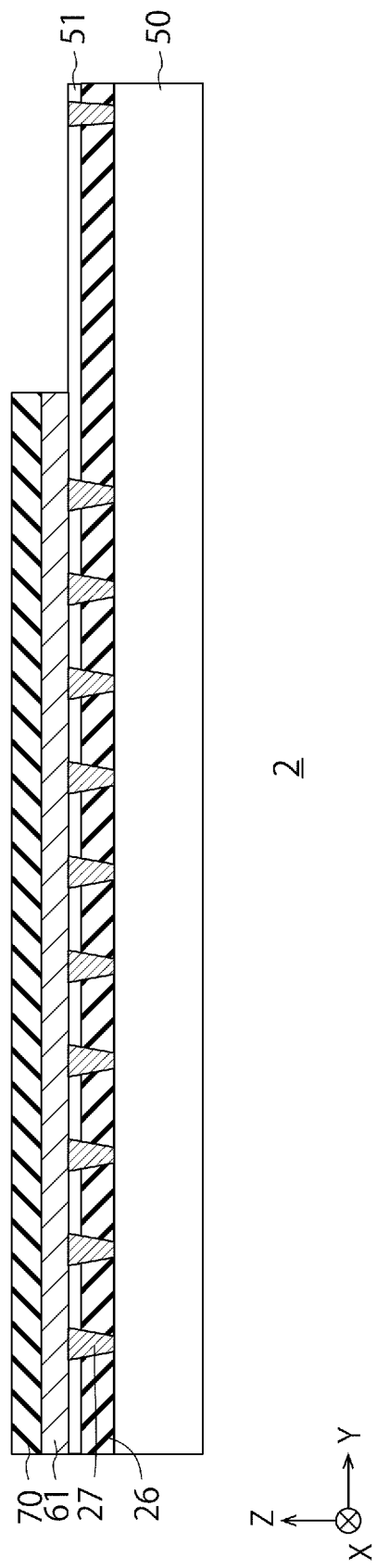
FIG. 6 is a cross-sectional view illustrating the example of the method for manufacturing the memory chip subsequent to FIG. 5.

Next, as illustrated in FIG. 6, a conductive film 61 is formed on the insulating films 26 and 51. A sacrificial film 70 is formed on the conductive film 61. For example, a conductive material such as doped polysilicon is used for the conductive film 61. For example, an insulating film such as a silicon nitride film is used for the sacrificial film 70. The conductive film 61 is left as a part of the source layer BSL later. Meanwhile, the sacrificial film 70 is replaced with, for example, a conductive material such as doped polysilicon, and thus, is removed.

Next, the conductive film 61 and the sacrificial film 70 are processed to be left in the formation position of the source layer BSL (below the stacked body 20) using a lithography technique and an etching technique.

Figure 7:
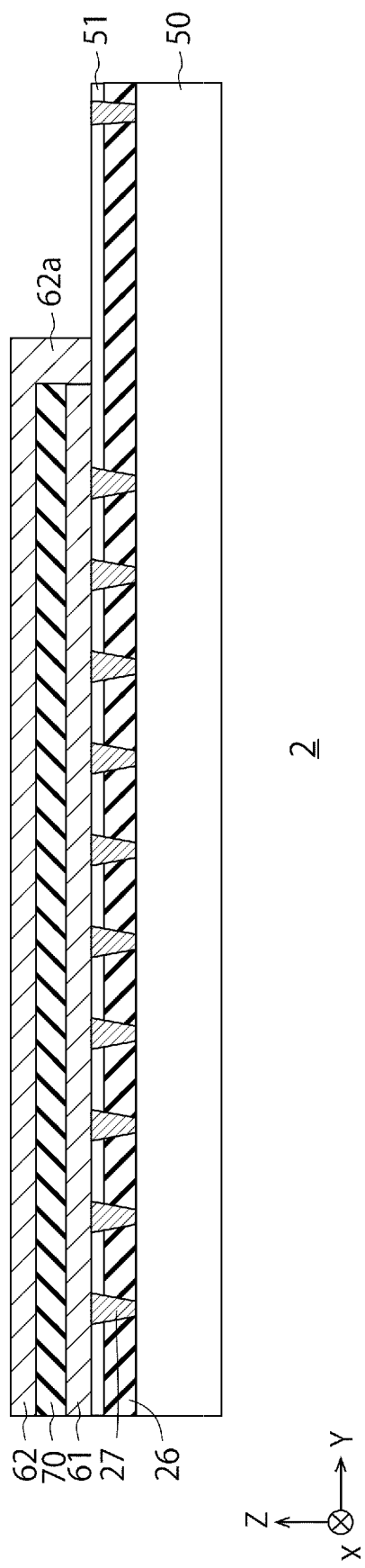
FIG. 7 is a cross-sectional view illustrating the example of the method for manufacturing the memory chip subsequent to FIG. 6.

Next, as illustrated in FIG. 7, a conductive film 62 is deposited on the sacrificial film 70. For example, a conductive material such as doped polysilicon is used for the conductive film 62. The conductive film 62 is processed using a lithography technique and an etching technique such that the conductive film 62 coats over the sacrificial film 70 and the side surfaces of the sacrificial film 70 and the conductive film 61. Therefore, the conductive film 62 is left on the sacrificial film 70 and a connecting portion 62a is left at the end portion (side portion) of the sacrificial film 70. The conductive films 61 and 62 are electrically connected to each other via the connecting portion 62a, and may function as an integral conductive film.

Figure 8:
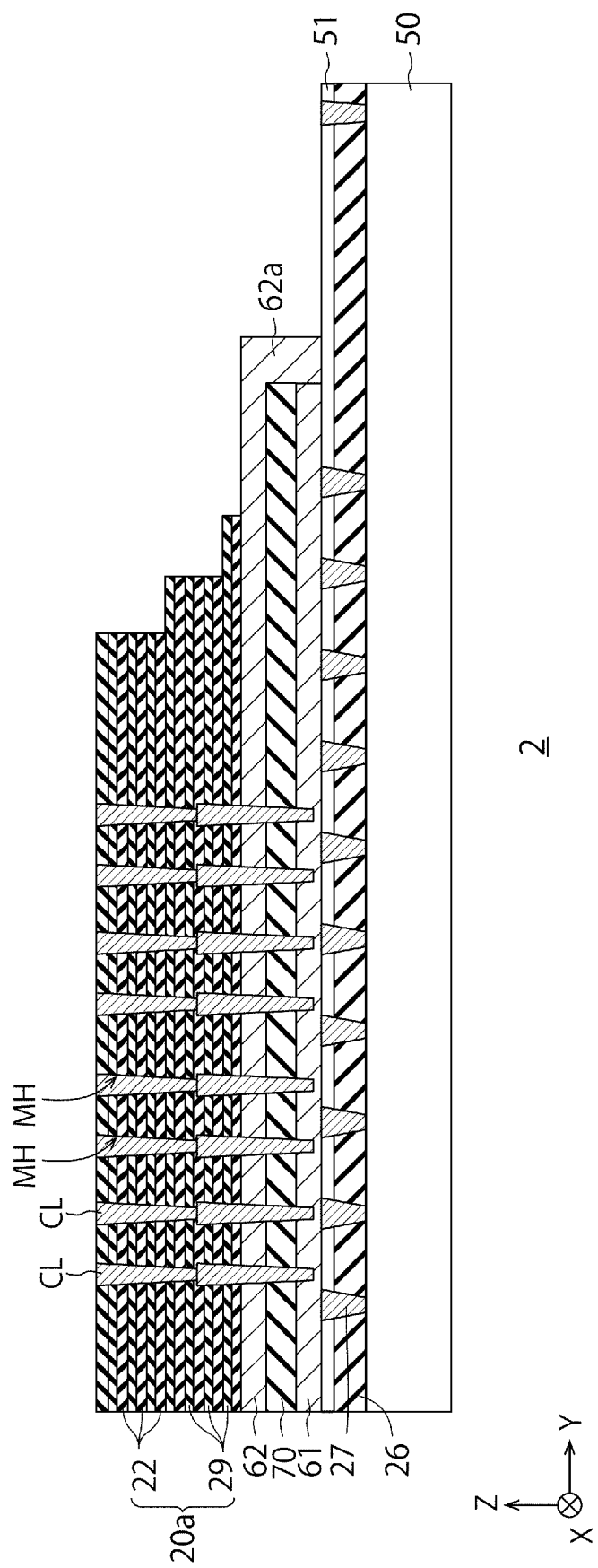
FIG. 8 is a cross-sectional view illustrating the example of the method for manufacturing the memory chip subsequent to FIG. 7.

Next, as illustrated in FIG. 8, a plurality of insulating films (stacked insulating film) 22 and a plurality of sacrificial films 29 are alternately stacked above the conductive films 61 and 62. For example, an insulating film such as a silicon oxide film is used for the insulating film 22. For example, an insulating film such as a silicon nitride film that may be etched with respect to the insulating film 22 is used for the sacrificial film 29. The stacked body of the stacked insulating film 22 and the sacrificial film 29 is called a stacked body 20a in the following.

Next, the end portion of the stacked body 20a of the insulating film 22 and the sacrificial film 29 is processed in a step shape to form the stepped portion 2s. Next, a plurality of memory holes MH that penetrates the stacked body 20a of the insulating film 22 and the sacrificial film 29 in the stacked direction (Z direction), and reaches the conductive films 61 and 62 is formed. The memory film 220, the semiconductor body 210, and the core layer 230 described with reference to FIGS. 3 and 4 are formed in each memory hole MH. Therefore, the columnar portion CL is formed so as to penetrate the stacked body 20a in the stacked direction. The columnar portion CL reaches the conductive films 61 and 62. In the embodiment, the memory hole MH and the columnar portion CL are formed in two stages at the upper portion and the lower portion of the stacked body 20a. However, the memory hole MH and the columnar portion CL may be formed in one stage with respect to the stacked body 20a.

Here, in the etching processing in which the memory hole MH is formed, when the memory hole MH reaches the conductive film 62 or 61, charges are stored in the conductive films 61 and 62.

If the contact 27 is not provided, the conductive films 61 and 62 are electrically suspended, and charged by the charge due to etching. The charges stored in the conductive films 61 and 62 cause arcing with the substrate 50 or other components. In order to address this, the conductive films 61 and 62 are connected to a conductor (not illustrated) provided in the dicing area to release the charges to the substrate 50 via the conductor. However, in this case, the conductive films 61 and 62 need to be connected to the conductor in the dicing area, and in the later, an additional processing for cutting off the connecting portion is required.

In this regard, according to at least one embodiment, the contact 27 that electrically connects the conductive film 61 to the substrate 50 is provided in the insulating film 26. The charges stored in the conductive films 61 and 62 may flow to the substrate 50 via the contact 27. Therefore, when the memory hole MH is formed, it is possible to prevent the occurrence of arcing. Further, it is not necessary to connect the conductive films 61 and 62 to the conductor provided in the dicing area. Therefore, it is not necessary to provide the connecting portion that connects the conductive films 61 and 62 and the conductor in the dicing area, or in the later, an additional processing in which the connecting portion is cut off is not necessary.

Further, as illustrated in FIG. 8, the connecting portion 62a is provided at the end portion of the sacrificial film 70, and electrically connects the conductive films 61 and 62 to each other. Therefore, when the memory hole MH is formed, at the time when the conductive film 62 is etched, the charges stored in the conductive film 62 may flow to the conductive film 61 via the connecting portion 62a. The charges may flow to the substrate 50 via the contact 27. That is, the connecting portion 62a may prevent the conductive film 62 from being electrically suspended, and may prevent the conductive film 62 from causing arcing with other components.

Figure 9:
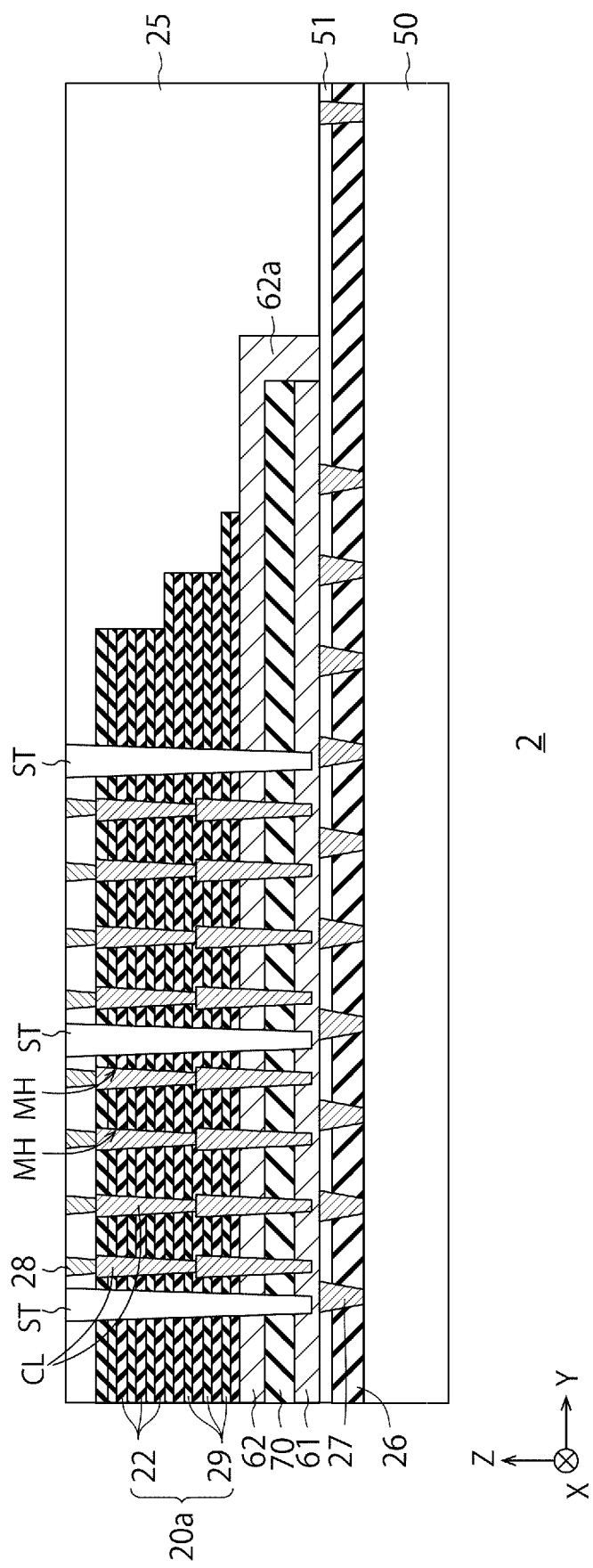
FIG. 9 is a cross-sectional view illustrating the example of the method for manufacturing the memory chip subsequent to FIG. 8.

Next, as illustrated in FIG. 9, an interlayer insulating film 25 is formed on the stacked body 20a. Next, the via 28 is formed on the columnar portion CL and the slits ST are formed in the stacked body 20a. The slit ST penetrates the stacked body 20a of the stacked insulating film 22 and the sacrificial film 29 in the Z direction, and reaches the conductive films 61 and 62. The slit ST extends in the X direction, and as described with reference to FIG. 2, divides the stacked body 20a so as to correspond to each block.

In the etching processing in which the slit ST is formed, when the slit ST reaches the conductive film 62 or 61, charges are stored in the conductive films 61 and 62. Therefore, as in the etching processing of the memory hole MH, arcing may cause a problem.

However, according to at least one embodiment, since the contacts 27 that electrically connect the conductive film 61 to the substrate 50 are provided, the charges stored in the conductive films 61 and 62 may flow to the substrate 50 via the contacts 27. Therefore, arcing may be prevented also in the forming processing of the slit ST.

Further, the connecting portion 62a is provided at the end portion of the sacrificial film 70, and electrically connects the conductive films 61 and 62 to each other. Therefore, when the slit ST is formed, the charges stored in the conductive film 62 may flow to the conductive film 61 via the connecting portion 62a. Therefore, it is possible to prevent the conductive film 62 from causing arcing with other components in the forming processing of the slit ST.

Figure 10:
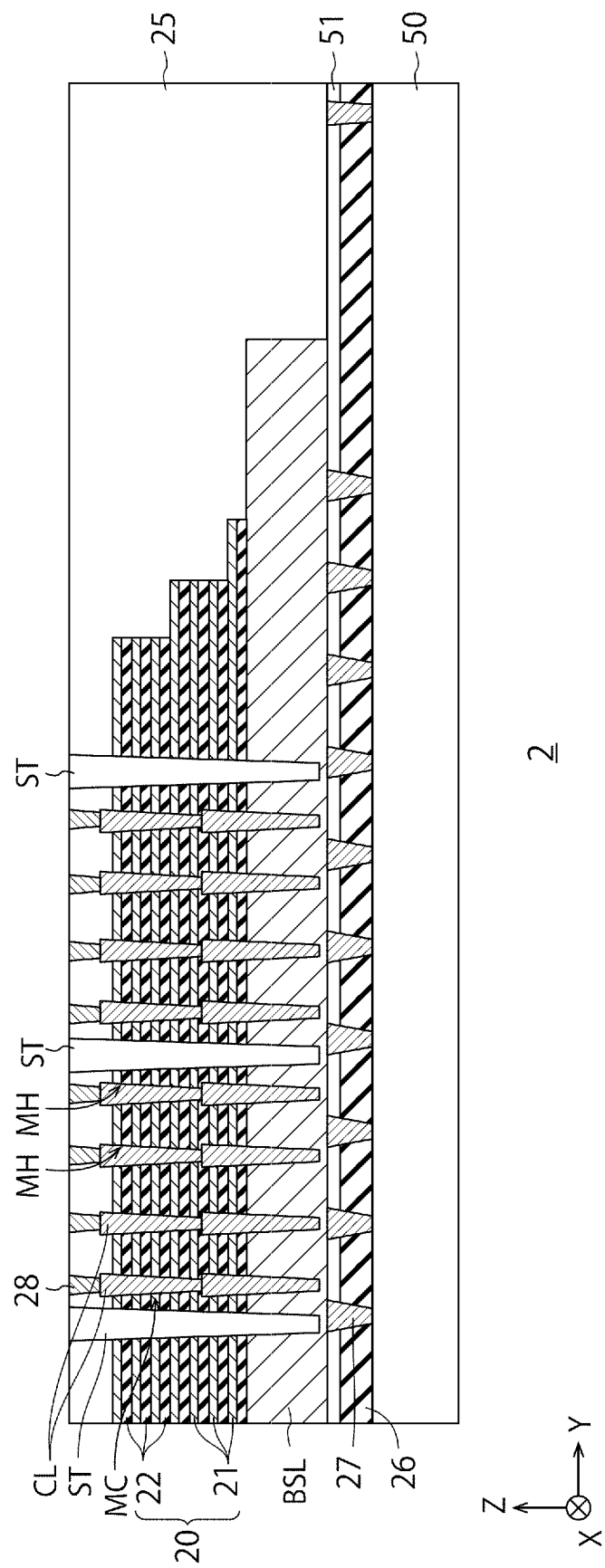
FIG. 10 is a cross-sectional view illustrating the example of the method for manufacturing the memory chip subsequent to FIG. 9.

Next, as illustrated in FIG. 10, the sacrificial film 70 is replaced with the conductive film via slit ST. That is, the sacrificial film 70 is removed by etching, and the material of the conductive film is filled in the space where the sacrificial film 70 was present. The material of the conductive film to be filled may be the same material as the conductive films 61 and 62, and is, for example, a conductive material such as doped polysilicon. Therefore, the conductive films 61 and 62 are integrated with the conductive film filled instead of the sacrificial film 70 to form the source layer BSL.

Next, the sacrificial film 29 of the stacked body 20a is replaced with the electrode film 21 via the slit ST. That is, the sacrificial film 29 is removed by etching, and the material of the electrode film 21 is filled in the space where the sacrificial film 29 was present. The material of the electrode film 21 to be filled is, for example, a low resistance metal such as tungsten. Therefore, the stacked body 20 in which a plurality of electrode films 21 and a plurality of insulating films 22 are alternately stacked is formed.

Figure 11:
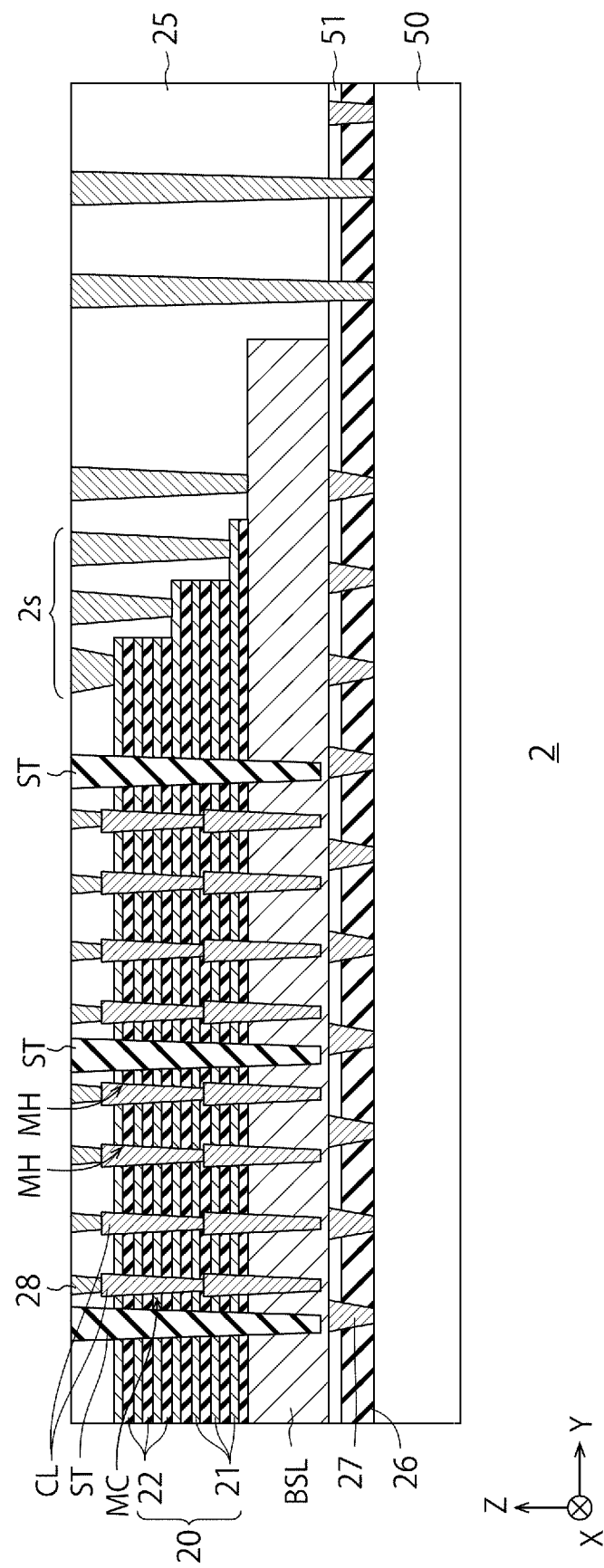
FIG. 11 is a cross-sectional view illustrating the example of the method for manufacturing the memory chip subsequent to FIG. 10.

Next, as illustrated in FIG. 11, the slit ST is filled with an insulating film such as a silicon oxide film. Next, contacts connected to, for example, the electrode film 21 (word line WL, drain-side select gate SGD, and source-side select gate SGS) in the stepped portion 2s are formed.

Next, as illustrated in FIG. 12, for example, the wiring 23 (bit line BL) and the wiring 24 are formed on the interlayer insulating film 25 and in the interlayer insulating film 25 to form a multi-layer wiring structure. After the wiring 24 is embedded, the interlayer insulating film 25 is polished using, for example, a CMP method until the wiring 24 is exposed. Therefore, the wiring 24 is exposed on the surface of the interlayer insulating film 25 at the substantially same height. Therefore, the memory chip 2 according to at least one embodiment is completed. In FIG. 1, the illustration of the insulating film 22 is omitted.

(Method for Manufacturing Controller Chip)

Figure 13:
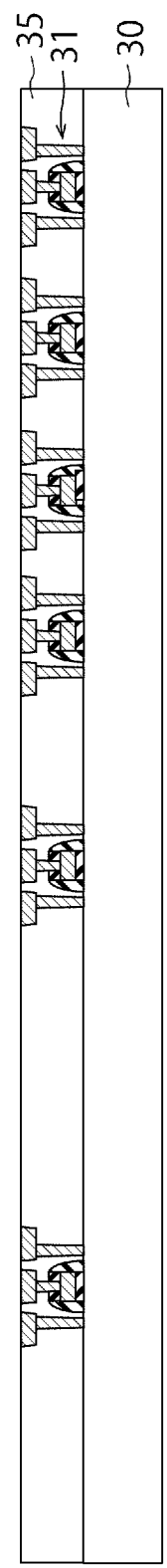
FIG. 13 is a cross-sectional view illustrating an example of a method for manufacturing a controller chip according to the first embodiment.
Figure 14:
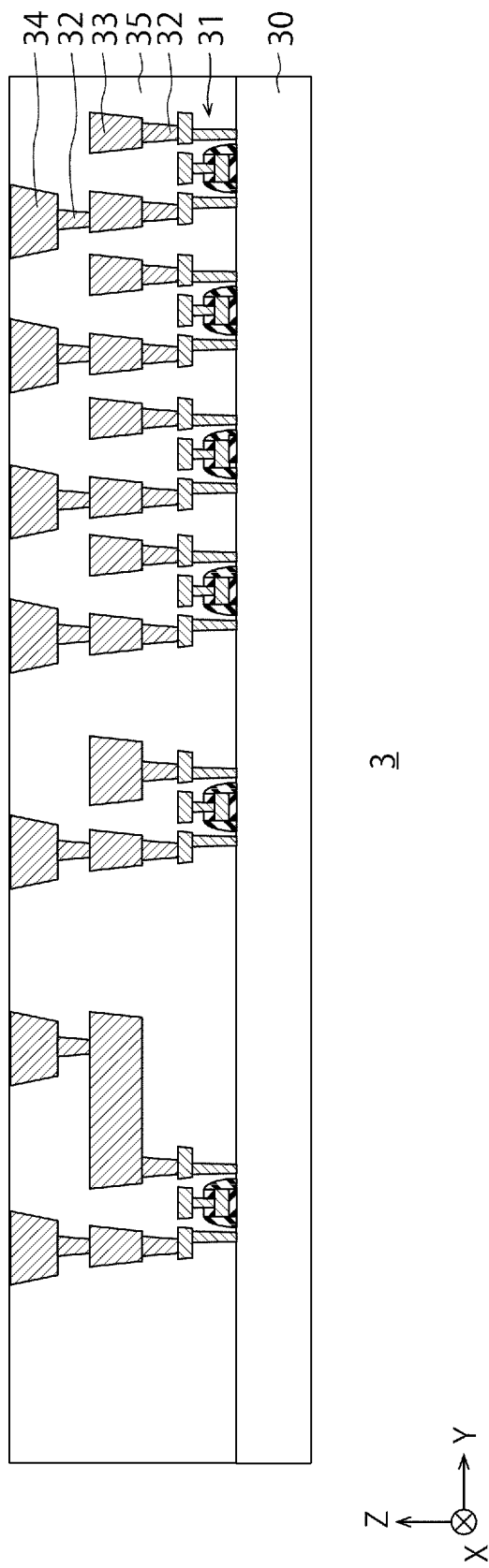
FIG. 14 is a cross-sectional view illustrating the example of the method for manufacturing the controller chip subsequent to FIG. 13.

FIGS. 13 and 14 are cross-sectional views illustrating an example of a method for manufacturing the controller chip 3 according to the first embodiment.

First, as illustrated in FIG. 13, the CMOS circuit including a semiconductor element such as a transistor is formed on the substrate 30 serving as a second substrate. Next, the CMOS circuit is coated with the interlayer insulating film 35.

Next, as illustrated in FIG. 14, the vias 32 and the wirings 33 and 34 are formed on the interlayer insulating film and in the interlayer insulating film 35 to form a multi-layer wiring structure. After the wiring 34 is embedded, the interlayer insulating film 35 is polished using, for example, a CMP method until the wiring 34 is exposed. Therefore, the wiring 34 is exposed on the surface of the interlayer insulating film 35 at the substantially same height. Therefore, the controller chip 3 according to the embodiment is completed.

(Bonding of Memory Chip 2 and Controller Chip 3)

Figure 15:
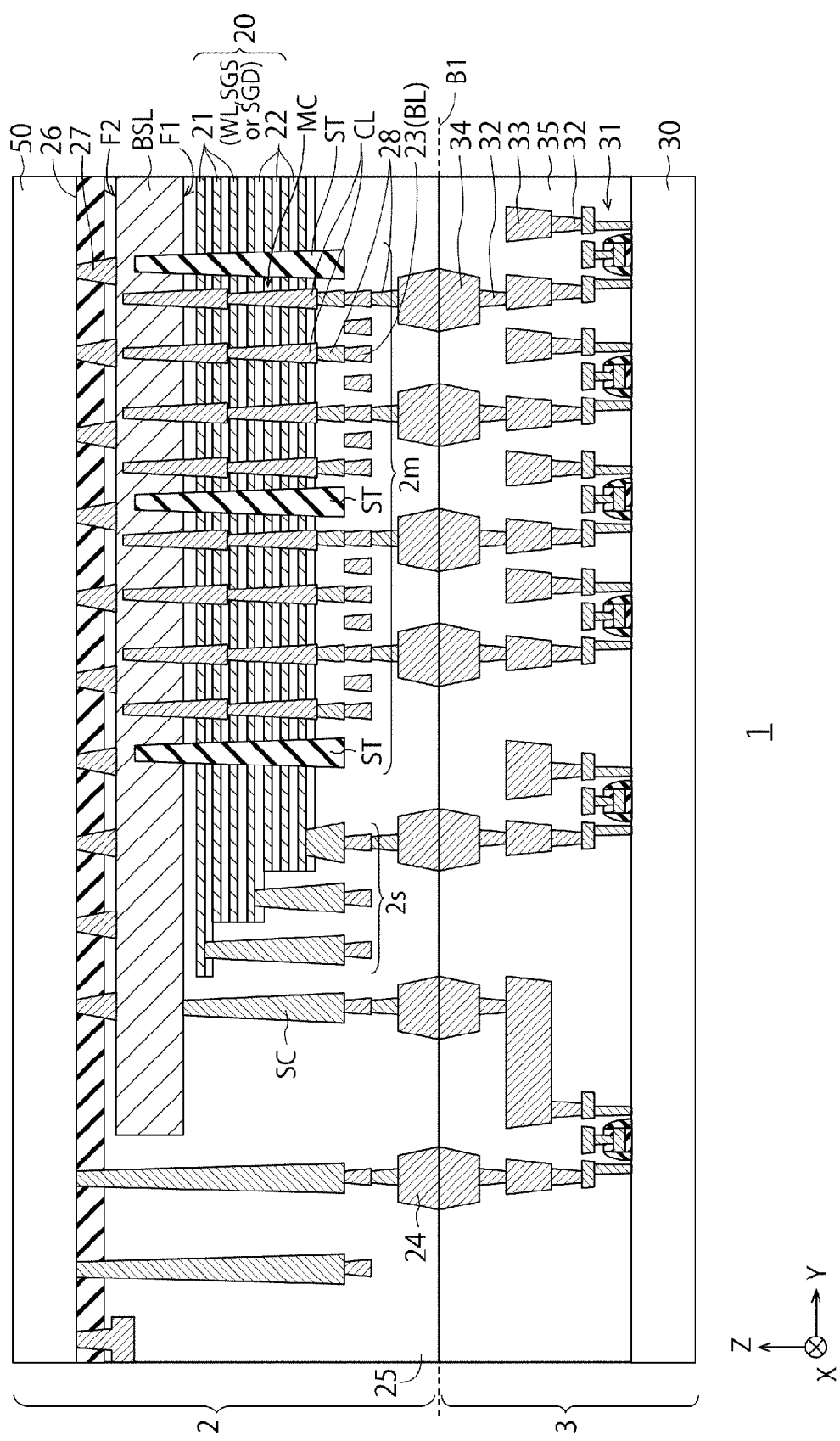
FIG. 15 is a cross-sectional view illustrating an example of a method for bonding the memory chip and the controller chip according to the first embodiment.
Figure 16:
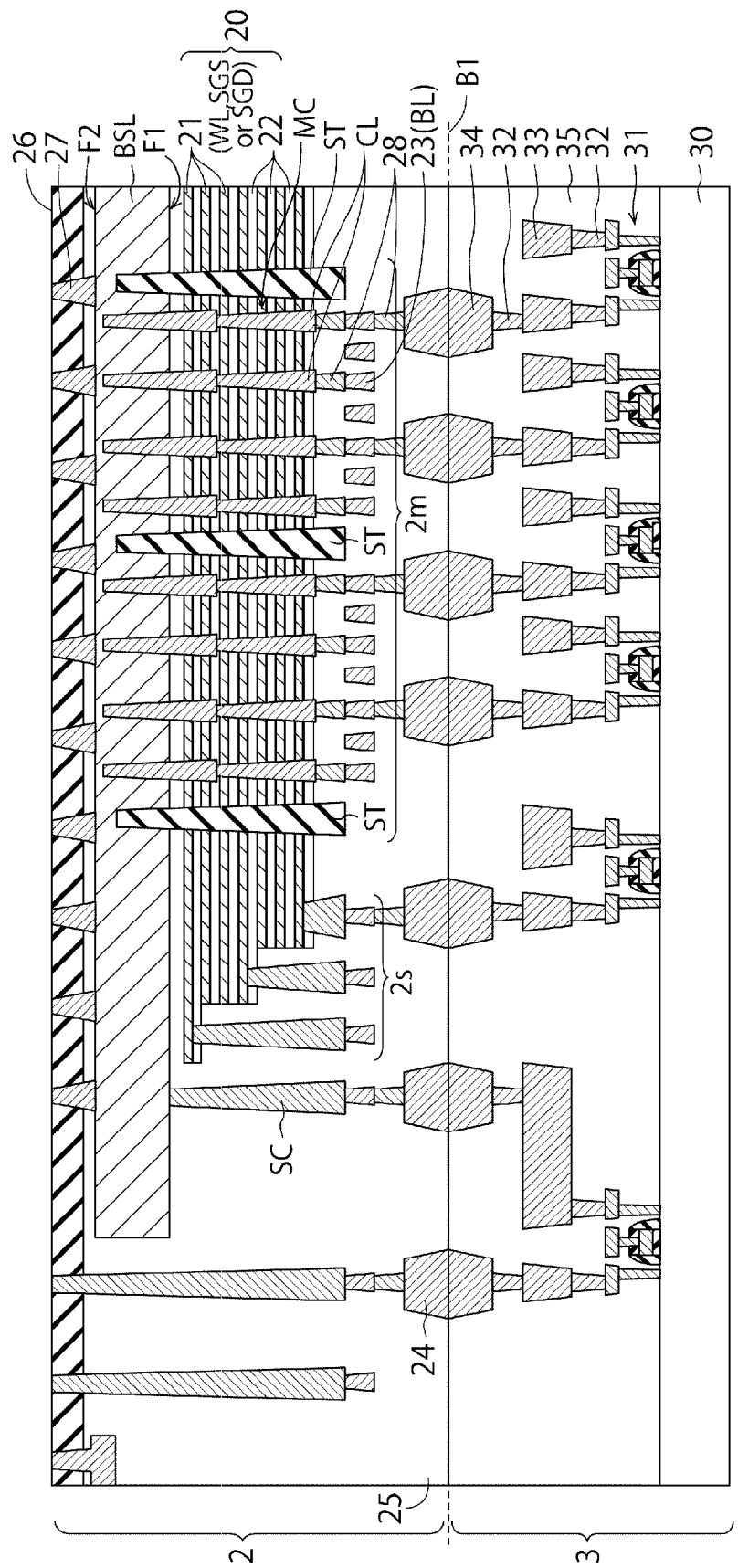
FIG. 16 is a cross-sectional view illustrating the example of the method for bonding subsequent to FIG. 15.

FIGS. 15 and 16 are cross-sectional views illustrating an example of a method for bonding the memory chip 2 and the controller chip 3 according to the first embodiment.

As illustrated in FIG. 15, the memory chip 2 illustrated in FIG. 12 is bonded onto the controller chip 3 illustrated in FIG. 13. At this time, the upper surface of the interlayer insulating film 25 and the upper surface of the interlayer insulating film 35 are bonded to each other such that the wirings 24 in the memory chip 2 and the wirings 34 in the controller chip 3 face each other. Therefore, the wirings 24 and the wirings 34 are bonded to each other. As a result, the CMOS circuit 31 of the controller chip 3 is electrically connected to the memory cell array 2m of the memory chip 2, and the CMOS circuit 31 may control the memory cell array 2m.

Next, as illustrated in FIG. 16, the substrate 50 is removed from the memory chip 2. The substrate 50 is polished using, for example, a CMP method until the contact 27 is exposed. Alternatively, the substrate 50 may be peeled from the contact 27 and the insulating film 26. When the substrate 50 is peeled off, the substrate 50 may be reused to form the memory chip 2 or the controller chip 3, or other semiconductor device.

Next, as illustrated in FIG. 1, the conductive films 41 and 42 are formed on the contact 27 and the insulating film 26. The semiconductor device 1 illustrated in FIG. 1 is completed by processing the conductive films 41 and 42 using a lithography technique and an etching technique.

The conductive films 41 and 42 are commonly connected to the contacts 27 connected to the source layer BSL of the same memory cell array 2m, and may apply the source potential to the source layer BSL at low resistance.

If the conductive films 41 and 42 and the contact 27 are not provided, the source potential is applied to the source layer BSL via a source contact SC in FIG. 1. The source contact SC is provided at the end portion of the memory cell array 2m, and a sufficiently stable source potential may not be provided to the memory cell MC far from the source contact SC. In order to address this, a local wiring (not illustrated) is provided embedded with a conductive material to a part of the slit ST. In this case, the local wiring applies the source potential to the source layer BSL in the middle of the memory cell array 2m, and functions as a buffer. However, in this case, it is necessary to add a forming processing of the local wiring, which increases the manufacturing processing of the memory chip 2.

In this regard, according to at least one embodiment, the source potential supplied from the source contact SC may be applied to the source layer BSL at both ends of the memory cell array 2m via the conductive films 41 and 42, and the contact 27. Therefore, a sufficiently stable source potential may be applied to the memory cell MC far from the source contact SC. Further, according to at least one embodiment, it is not necessary to provide the local wiring. Therefore, the forming processing of the local wiring may be omitted and the manufacturing processing of the memory chip 2 may be shortened.

Further, in the forming processing of the memory hole MH and the slit ST, the contact 27 may flow the charges generated due to etching from the conductive films 61 and 62 (source layer BSL) to the substrate 50 at low resistance.

If the contact 27 is not provided in the forming processing of the memory hole MH and the slit ST, in order to release the charges stored in the conductive films 61 and 62, the conductive films 61 and 62 need to be electrically connected to the substrate 50 via a conductive film (not illustrated) formed in the dicing area. In this case, a connecting portion (not illustrated) provided between the conductive films 61 and 62 and the conductive film in the dicing area is formed. However, the connecting portion becomes unnecessary after the memory hole MH and the slit ST are formed. Therefore, an additional processing for cutting off the connecting portion is required, which increases the manufacturing processing of the memory chip 2.

According to at least one embodiment, in the forming processing of the memory hole MH and the slit ST, the contacts 27 electrically connects the conductive films 61 and 62 and the substrate 50. Therefore, the charges generated by etching may flow from the conductive films 61 and 62 to the substrate 50 via the contacts 27. The contacts 27 are arranged substantially evenly under the source layer BSL, and connect the conductive films 61 and 62 and the substrate 50 at low resistance. Therefore, the contact 27 may prevent arcing in the forming processing of the memory hole MH and the slit ST. Therefore, in at least one embodiment, the connecting portion between the conductive films 61 and 62 and the conductive film in the dicing area is unnecessary. That is, in at least one embodiment, an additional processing for cutting off the connecting portion is not necessary.

Further, the contact 27 is formed at the same time as the alignment mark of the insulating film 26. Therefore, there is no additional processing in forming the contact 27.

Further, after the semiconductor device 1 is completed, the contact 27 connects the source layer BSL and the conductive films 41 and 42 at low resistance, and has a bypass function of transmitting the source potential to the end portion of the memory cell array 2m at low resistance. Therefore, the contact 27 has both a function of preventing arcing in the forming processing of the memory hole MH and the slit ST, and a function of substantially evenly transmitting the source potential to the entire memory cell array 2m.

The semiconductor device 1 according to at least one embodiment is formed by individually forming the memory chip 2 and the controller chip 3 and bonding the wirings 24 and 34 to each other. In this case, in the forming processing of the memory chip 2, the CMOS circuit 31 is not provided below the source layer BSL (between the substrate 50 and the conductive films 61 and 62). Therefore, it is possible to provide an area for forming the contact 27 between the substrate 50 and the conductive films 61 and 62 (source layer BSL). That is, since the semiconductor device 1 has a CMOS bonding array (CBA) structure, the area for forming the contact 27 may be provided between the substrate 50 and the conductive films 61 and 62 (source layer BSL).

Further, it is possible to prevent the wrapping of the semiconductor device 1 by providing the contact 27.

Second Embodiment

A configuration of the semiconductor device 1 according to a second embodiment is substantially the same as that in FIG. 1. However, the second embodiment is different from the first embodiment in that the contact 27 is simultaneously formed in the forming processing of the conductive film 62. The contact 27 is made of the same material as the conductive film 62 (i.e., source layer BSL).

Hereinafter, a method for manufacturing the semiconductor device 1 according to the second embodiment will be described.

(Method for Manufacturing Memory Chip)

FIGS. 17 to 20 are cross-sectional views illustrating an example of a method for manufacturing the memory chip 2 according to the second embodiment.

Figure 17:
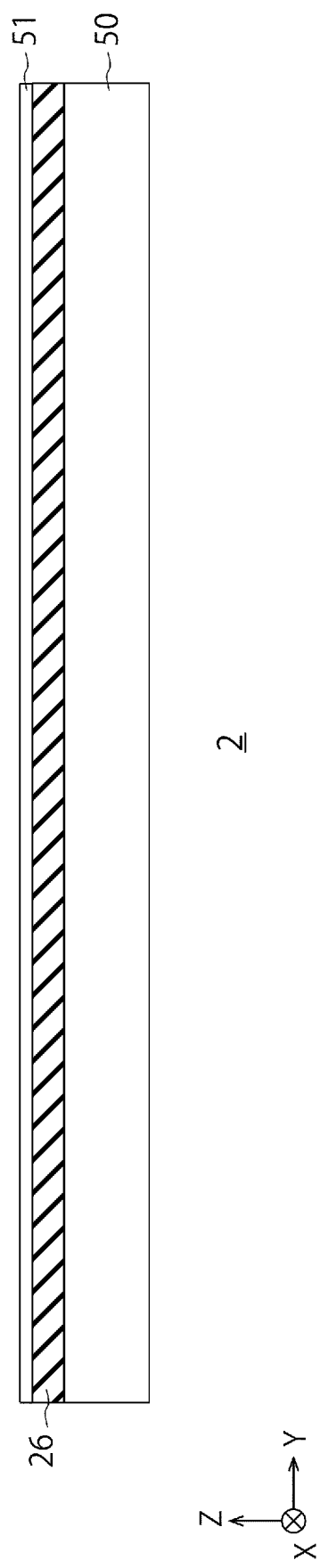
FIG. 17 is a cross-sectional view illustrating an example of a method for manufacturing a memory chip according to a second embodiment.
Figure 18:
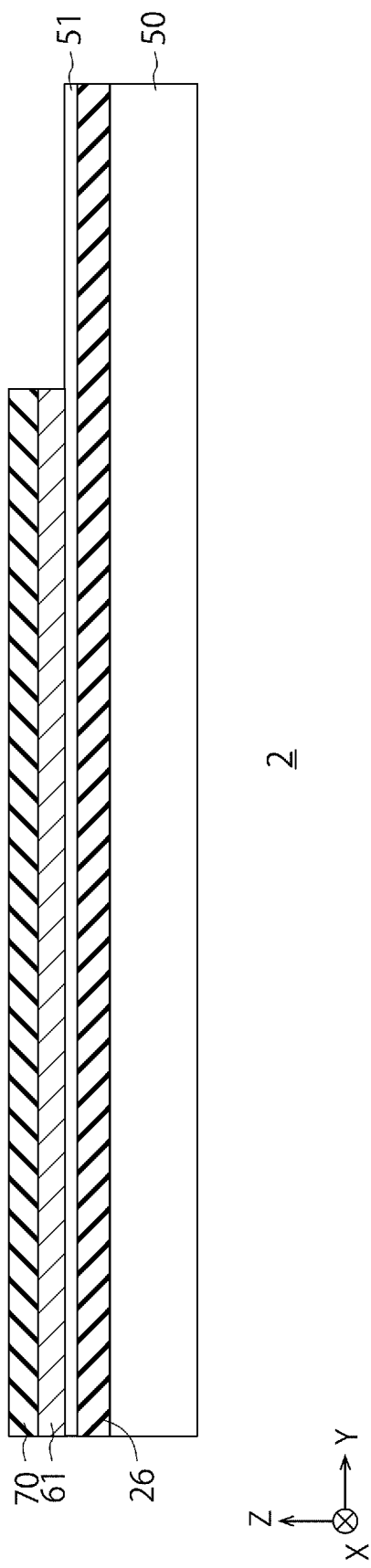
FIG. 18 is a cross-sectional view illustrating the example of the method for manufacturing the memory chip subsequent to FIG. 17.

First, as illustrated in FIG. 17, the insulating films 26 and 51 are formed on the substrate 50. In this stage, the contact 27 is not formed.

Next, the conductive film 61 is formed on the insulating films 26 and 51. The sacrificial film 70 is formed on the conductive film 61. The conductive film 61 and the sacrificial film 70 are processed using a lithography technique and an etching technique to leave the conductive film 61 and the sacrificial film 70 on the forming area of the source layer BSL.

Figure 19:
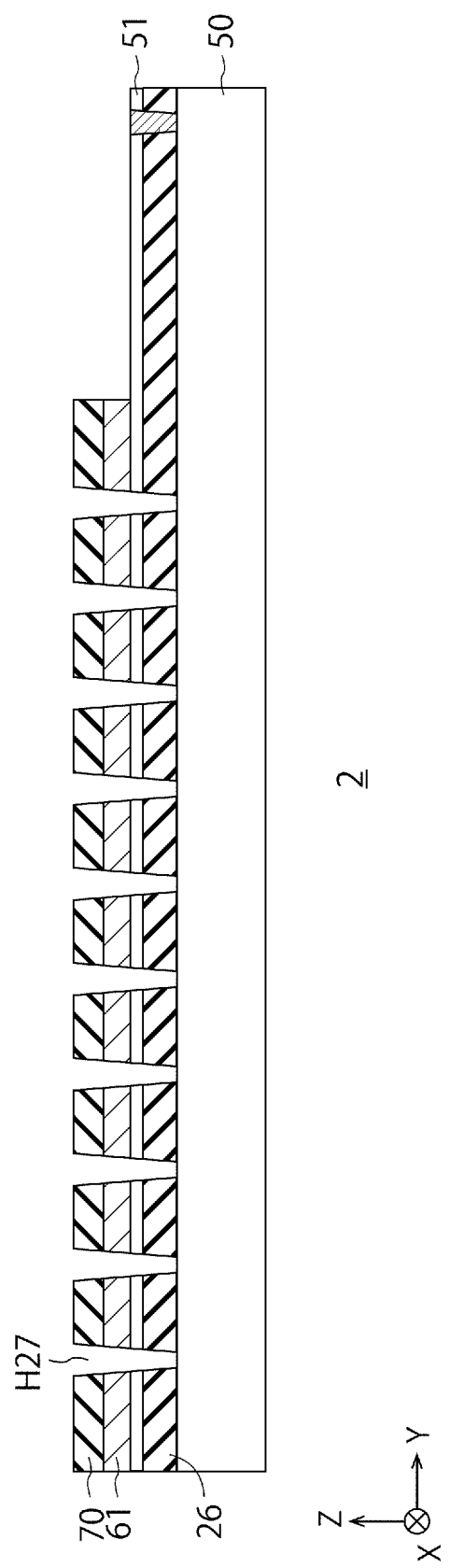
FIG. 19 is a cross-sectional view illustrating the example of the method for manufacturing the memory chip subsequent to FIG. 18.

Next, as illustrated in FIG. 19, contact holes H27 are formed using a lithography technique and an etching technique. The contact holes H27 are formed to penetrate the sacrificial film 70, the conductive film 61, and the insulating films 51 and 26 and reach the substrate 50. The contact holes H27 are formed to be arranged substantially evenly in the forming areas of the stacked body 20 and the source layer BSL. Therefore, the charges stored in the conductive films 61 and 62 may be released to the substrate 50 at low resistance.

Figure 20:
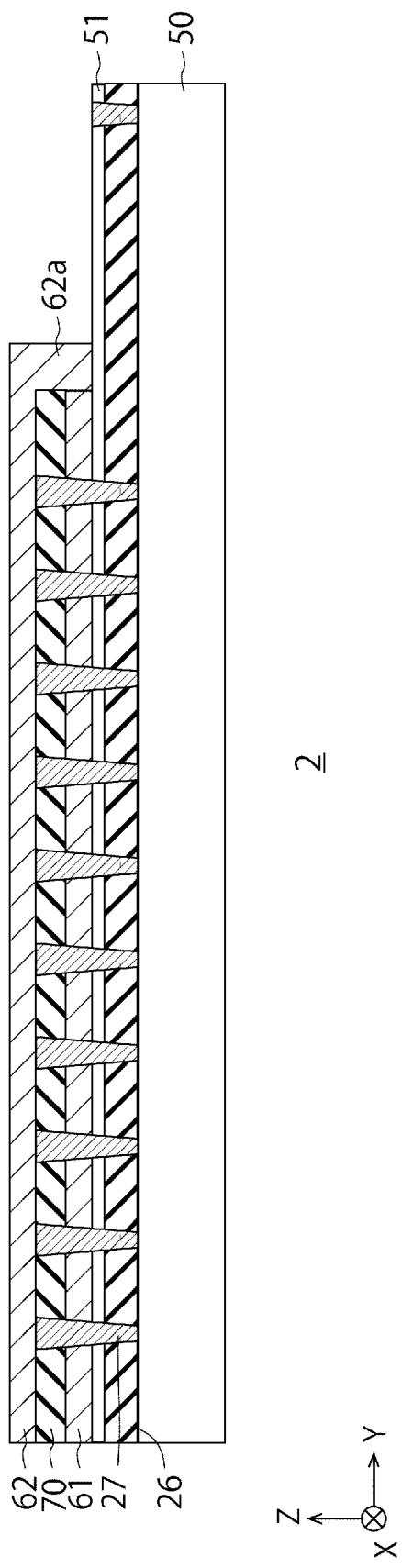
FIG. 20 is a cross-sectional view illustrating the example of the method for manufacturing the memory chip subsequent to FIG. 19.

Next, as illustrated in FIG. 20, the material of the conductive film 62 is deposited on the sacrificial film 70 and in the contact holes H27. Therefore, the conductive film 62 is formed on the sacrificial film 70, and the material of the conductive film 62 is filled in the contact holes H27. Therefore, the contact 27 electrically connects the conductive films 61 and 62 and the substrate 50. In this processing, the conductive film 62 and the contact 27 are formed at the same time.

Next, the conductive film 62 is processed using a lithography technique and an etching technique such that the conductive film 62 coats over the sacrificial film 70 and the side surfaces of the sacrificial film 70 and the conductive film 61. Therefore, the conductive film 62 is left on the sacrificial film 70 and the connecting portion 62a is left at the end portion (side portion) of the sacrificial film 70. The conductive films 61 and 62 are electrically connected to each other via the connecting portion 62a, and may function as an integral conductive film.

Thereafter, the memory chip 2 is completed through the processing described with reference to FIGS. 8 to 12. The method for forming the controller chip 3, and the method for bonding the memory chip 2 and the controller chip 3 are as described in the first embodiment.

Although the method for forming the contact 27 is different in the second embodiment, the contact 27 has the same function and effect as that of the first embodiment. Therefore, the semiconductor device 1 according to the second embodiment may obtain the same effect as that of the first embodiment.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
   a stacked body including a plurality of stacked first electrode films that are insulated from each other;
   a plurality of semiconductor members extending in the stacked body of the plurality of first electrode films;
   a plurality of charge storage members disposed between the plurality of first electrode films and the plurality of semiconductor members;
   a first conductive film having a first surface and a second surface opposite to the first surface, the first conductive film being commonly connected to the plurality of semiconductor members on the first surface;
   a first insulating film disposed on the second surface of the first conductive film;
   a plurality of contacts arranged over the stacked body, disposed in the first insulating film, and respective lower surfaces of the plurality of contacts directly connected to and aligned with the second surface of the first conductive film that is an uppermost surface of the first conductive film; and
   a second conductive film disposed on the first insulating film and connected to the contacts.

2. The semiconductor device according to claim 1, further comprising:
   a semiconductor element disposed below the stacked body.

3. The semiconductor device according to claim 2, wherein both the semiconductor element and the stacked body are disposed on the first surface side of the first conductive film.

4. The semiconductor device according to claim 2, further comprising:
   a second insulating film configured to coat the stacked body;
   a first wiring connected to the semiconductor member, the first wiring embedded in the second insulating film, and the first wiring exposed on a surface of the second insulating film;
   a third insulating film configured to coat the semiconductor element; and
   a second wiring connected to the semiconductor element, the second wiring embedded in the third insulating film, and the second wiring exposed on a surface of the third insulating film;
   wherein the first wiring and the second wiring are bonded to each other on a substantially same surface as a bonding surface between the second insulating film and the third insulating film.

5. The semiconductor device according to claim 1, wherein the plurality of semiconductor members are commonly connected to the first conductive film at one end of the plurality of semiconductor members.

6. The semiconductor device according to claim 1, wherein the plurality of first electrode films are isolated from each other via a plurality of insulating films.

7. The semiconductor device according to claim 6, wherein the plurality of insulating films include at least one of porous insulating films or air gaps.

8. The semiconductor device according to claim 6, further comprising barrier films between the plurality of insulating films and the plurality of first electrode films.

9. The semiconductor device according to claim 6, further comprising barrier films between the plurality of electrode films and the charge storage members.

10. The semiconductor device according to claim 1, wherein the plurality of semiconductor members are tubular shaped.

11. The semiconductor device according to claim 1, wherein the plurality of contacts are evenly arranged in an X-Y plane over the stacked body.

12. The semiconductor device according to claim 1, wherein the plurality of contacts each have a tapered shape in the stacking direction.

13. A method for manufacturing a semiconductor device comprising:

forming a first insulating film on a first substrate;

forming a plurality of contacts that extend into the first insulating film;

forming a first conductive film on the contacts;

forming a stacked body on the first conductive film including alternately stacked insulating films and sacrificial films;

forming a plurality of holes that penetrates the stacked body in a stacked direction and reaches the first conductive film;

forming a charge storage member and a semiconductor member in the plurality of holes;

replacing the sacrificial films with a plurality of first electrode films to thereby form a stacked body of the plurality of first electrode films, the plurality of first electrode films stacked so as to be insulated from each other;

removing the first substrate from the first insulating film thereby exposing the contacts; and forming a second conductive film on the first insulating film and the contacts.

14. The method according to claim 13, wherein the contact is formed from at least one of doped polysilicon, tungsten or copper.

15. The method according to claim 13, wherein the method forms a memory chip, and further comprising bonding the memory chip to a controller chip.

16. The method according to claim 13, wherein the contact and the first conductive film are formed at a same time.

17. The method according to claim 13, wherein the plurality of contacts are evenly arranged in an X-Y plane over the stacked body.

* * * * *